(12) United States Patent
Huang et al.

(10) Patent No.: US 9,386,686 B2
(45) Date of Patent: Jul. 5, 2016

(54) METAL CORE PRINTED CIRCUIT BOARD AND ELECTRONIC PACKAGE STRUCTURE

(75) Inventors: Chi-Feng Huang, Taipei (TW); Bau-Ru Lu, Chang Hua County (TW); Da-Jung Chen, Tao Yuan County (TW); Jeng-Jen Li, Tai Pei (TW)

(73) Assignee: CYNTEC CO., LTD., Hsin-Chu (TW)

( * ) Notice: Subject to any disclaimer, the term of this patent is extended or adjusted under 35 U.S.C. 154(b) by 926 days.

(21) Appl. No.: 13/450,229

(22) Filed: Apr. 18, 2012

(65) Prior Publication Data

US 2012/0268896 A1 Oct. 25, 2012

(30) Foreign Application Priority Data

Apr. 20, 2011 (TW) ............................... 100113641 A

(51) Int. Cl.
*H05K 7/20* (2006.01)
*H05K 1/02* (2006.01)
*H05K 3/44* (2006.01)
*H05K 1/18* (2006.01)

(52) U.S. Cl.
CPC ............ *H05K 1/0204* (2013.01); *H05K 1/0203* (2013.01); *H05K 1/181* (2013.01); *H05K 3/445* (2013.01); *H01L 2224/48091* (2013.01); *H01L 2224/48247* (2013.01); *H01L 2224/48248* (2013.01); *H01L 2924/1305* (2013.01); *H01L 2924/13055* (2013.01); *H01L 2924/13091* (2013.01); *H05K 1/021* (2013.01); *H05K 1/184* (2013.01); *H05K 2201/10515* (2013.01); *Y02P 70/611* (2015.11)

(58) Field of Classification Search
CPC ... H05K 1/021; H05K 1/0204; H05K 1/0207; H05K 1/184; H05K 3/445; H05K 1/0203; H05K 2201/10515; H05K 1/026; H05K 1/181; H01L 2224/48248; H01L 2224/48247; H01L 2224/48091; H01L 2924/1305; H01L 2924/13055; H01L 2924/13091; H01L 2924/00; H01L 2924/00014; Y02P 70/611
USPC .................................. 174/264–267; 361/720
See application file for complete search history.

(56) References Cited

U.S. PATENT DOCUMENTS

| | | | | |
|---|---|---|---|---|
| 3,346,689 A * | 10/1967 | Parstorfer | ............... | B29C 70/84 174/265 |
| 3,573,707 A * | 4/1971 | Reynolds | ....................... | 174/263 |
| 5,281,770 A * | 1/1994 | Kamei et al. | ................... | 174/261 |
| 5,290,970 A * | 3/1994 | Currie | .................... | H05K 3/225 174/250 |
| 5,293,502 A * | 3/1994 | Kimura | ................. | H01L 21/486 174/250 |
| 5,600,099 A * | 2/1997 | Crotzer | ................ | H01R 13/035 174/257 |
| 6,212,086 B1 | 4/2001 | Dinh | | |
| 2004/0051172 A1* | 3/2004 | Miyazaki et al. | ............. | 257/706 |
| 2006/0137907 A1* | 6/2006 | Chheda et al. | ................ | 174/262 |

(Continued)

*Primary Examiner* — Anatoly Vortman
*Assistant Examiner* — Jacob Crum
(74) *Attorney, Agent, or Firm* — Muncy, Geissler, Olds & Lowe, P.C.

(57) ABSTRACT

An electronic package structure is provided which comprises a metal core PCB, an energy storage device and at least one electronic component. The at least one electronic component is disposed between the metal core PCB and the energy storage device. The metal core PCB defines at least a through hole. A thermal passage is disposed in the through hole. An insulating layer is disposed in the through hole and located between the metal layer of the metal core PCB and the thermal passage to prevent the electric coupling between the thermal passage and the metal layer. The energy storage device comprises at least a connecting pin in thermal contact with the thermal passage.

9 Claims, 4 Drawing Sheets

(56) References Cited

U.S. PATENT DOCUMENTS

| | | | |
|---|---|---|---|
| 2006/0215379 A1* | 9/2006 | Zollo et al. | 361/761 |
| 2008/0142258 A1* | 6/2008 | Caletka et al. | 174/264 |
| 2009/0113705 A1* | 5/2009 | McKinley et al. | 29/852 |
| 2009/0308651 A1* | 12/2009 | Abe et al. | 174/264 |
| 2010/0226098 A1* | 9/2010 | Loibl et al. | 361/721 |
| 2011/0061233 A1* | 3/2011 | Martinez-Vargas et al. | 29/839 |

* cited by examiner

METAL CORE PRINTED CIRCUIT BOARD AND ELECTRONIC PACKAGE STRUCTURE

BACKGROUND OF THE INVENTION (a) Field of the Invention

The invention relates to a metal core printed circuit board and an electronic package structure, particularly to a metal core printed circuit board and an electronic package structure having better heat dissipation.

(b) Description of the Related Art

FIG. 1 shows a DC-to-DC converter package according to the prior art. As shown in FIG. 1, the DC-to-DC converter package is disclosed in U.S. Pat. No. 6,212,086. DC-to-DC converter package 100 comprises circuit board 120, copper plate 110 and a plurality of electronic components. Copper plate 110 is clad to the bottom surface of circuit board 120 and thus allows heat to be approximately equally distributed over the bottom of the package. The electronic components include main transformer 130, output inductor 140, synchronous rectifier 150, output capacitor 160 and input capacitor 170, and are disposed on circuit board 120 so that the electronic components may be coupled to each other through the circuit layout inside circuit board 120. One stand-alone output connector is disposed on the right-hand side of circuit board 120 and coupled to circuit board 120 through a flexible printed circuit board. The disadvantage of this prior art is that circuit board 120 is not a good heat sink and cannot efficiently dissipate heat generated by electronic components 130, 140, 150, 160 and 170 thereon to copper plate 110. The use of circuit board 120 would make it easy to allocate the circuit layout but make it difficult to dissipate heat. On the contrary, the use of copper plate 110 would make it difficult to allocate the circuit layout but make it easy to dissipate heat. It is urged by those who are skilled in the art to develop one substrate having both advantages of easy circuit allocation and heat dissipation.

BRIEF SUMMARY OF THE INVENTION

One object of the invention is to provide an electronic package structure having better heat dissipation than the prior technology. An electronic package structure according to the invention is suitable to circuits and electronic components having small volume and high density. In one embodiment, one object of the invention is to provide a metal core printed circuit board suitable to be used in an electronic package structure.

One embodiment of the invention provides an electronic package structure, comprising a metal core PCB, an energy storage device and at least one electronic component. The metal core PCB comprises a first surface and a second surface and defines at least a through hole. The first surface is opposite to the second surface and the through hole extends from the first surface to the second surface. The metal core PCB comprises a metal layer, a circuit layer, at least one thermal passage and at least one insulating layer. The circuit layer is disposed on the metal layer and comprises a circuit layout. The thermal passage is disposed in the through hole. The insulating layer is disposed in the through hole and disposed between the thermal passage and the metal layer to prevent the thermal passage and the metal layer from being electrically coupled. The energy storage device comprises at least a connecting pin, being in thermal contact with the thermal passage and extending along a direction away from the energy storage device so that a storage space is formed between the energy storage device and the metal core PCB. At least one of the electronic components is coupled to the circuit layout and disposed in the storage space.

Furthermore, one embodiment of the invention provides a metal core printed circuit board, comprising a first surface and a second surface and defining at least one through hole. The first surface is opposite to the second surface and the through hole extends from the first surface to the second surface. The metal core PCB comprises a metal layer, a circuit layer, at least one thermal passage and at least one insulating layer. The circuit layer is disposed on the metal layer and comprises a circuit layout. The thermal passage is disposed in the through hole and the insulating layer is disposed in the through hole and disposed between the thermal passage and the metal layer to prevent the thermal passage and the metal layer from being electrically coupled. When an electronic device is electrically coupled to the thermal passage, the electronic device and the metal layer are electrically insulated from each other.

In one embodiment, the at least one through hole, the at least one insulating layer and the at least one thermal passage each are plural. The electronic components comprise a first electronic component and a second electronic component. Heat generated by the first electronic component is larger than that by the second electronic component and the first electronic component is in thermal contact with one of the thermal passages.

In one embodiment, the insulating layer can comprise a plastic sheath or insulating film and the thermal passage can comprise a rivet or thermally conductive material. Preferably, the thermal passage is made of metal. In one embodiment, the electronic package structure can be a DC-to-DC converter package.

As described in the above, a storage space is formed between the energy storage device and the metal core PCB, and a plurality of electronic components can be disposed on the metal core PCB and in the storage space so that a stacking structure is formed to have the space be effectively utilized and a high density integrated power device can be formed. Besides, since the metal core PCB is formed with the insulating layer and the thermal passage, the connecting pin of the energy storage device can be coupled to the thermal passage and the heat generated by the energy storage device can be conducted to the second side of the metal core PCB through the connecting pin and the thermal passage. When the thermal passage is made of metal, the thermal passage can be used to conduct electricity and to electrically connect to an external substrate (not shown in the figure).

In one embodiment, in the metal core PCB, a thermal passage and an insulating layer are in the through hole and the thermal passage is electrically insulated from the metal layer of the metal core PCB. Thus, when an electronic component is electrically coupled to the thermal passage, the electronic component is electrically insulated from the metal layer of the metal core PCB without being short circuited so that an external circuit substrate can be electrically coupled.

Other objects and advantages of the invention can be better understood from the technical characteristics disclosed by the invention. In order to clarify the above mentioned and other objects and advantages of the invention, examples accompanying with figures are provided and described in details in the following.

DETAILED DESCRIPTION OF THE INVENTION

Figure 1:
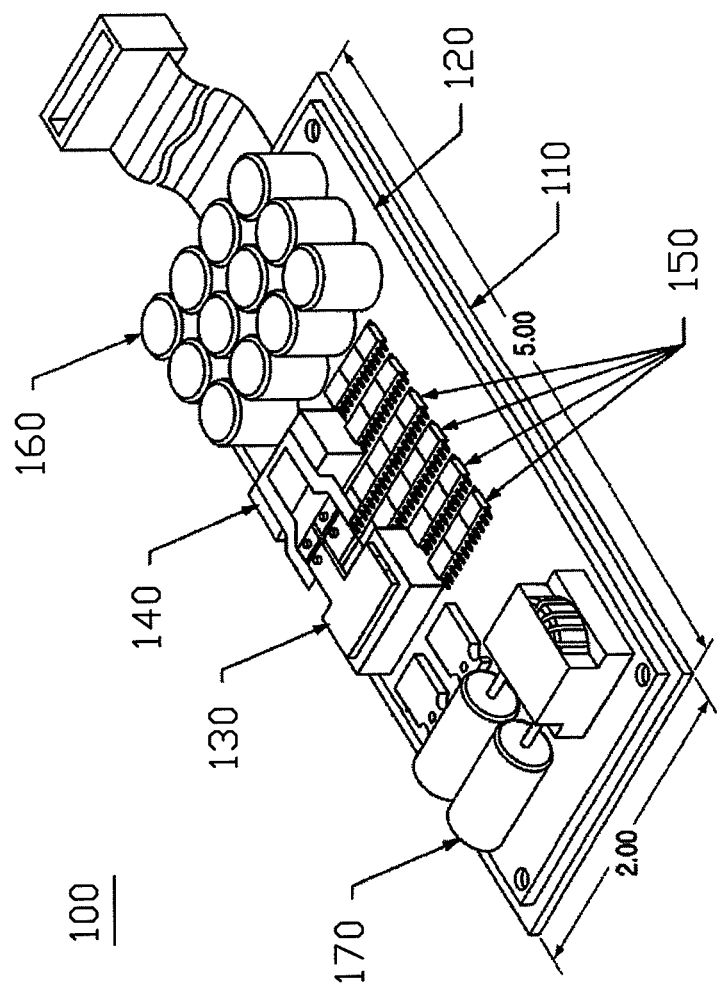
FIG. 1 shows a schematic diagram illustrating a DC-to-DC converter package according to the prior art.
Figure 2:
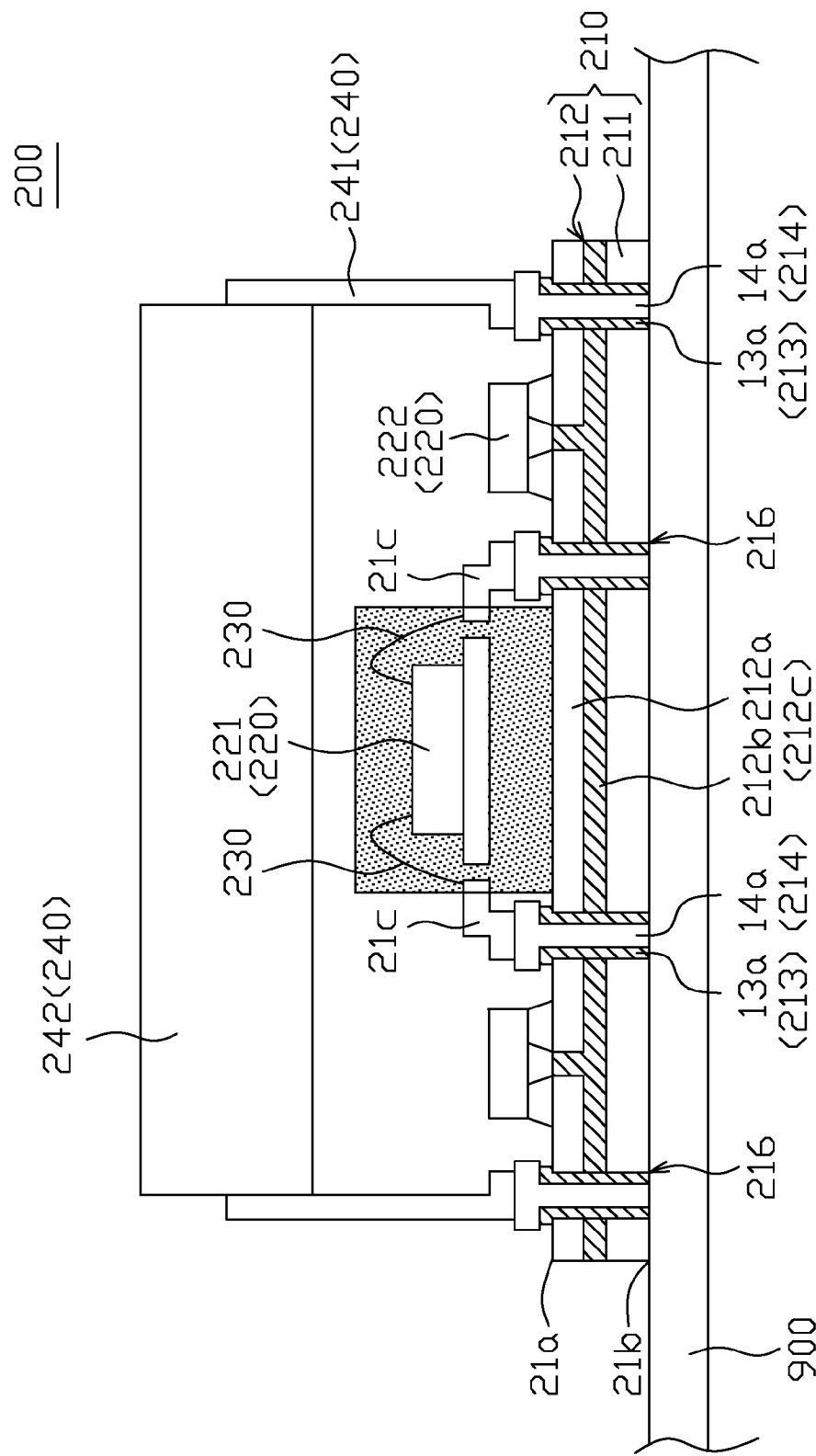
FIG. 2 shows a schematic diagram illustrating an electronic package structure according to one embodiment of the invention.

FIG. 2 shows a schematic diagram illustrating an electronic package structure according to one embodiment of the invention. In one embodiment of the invention, electronic package structure 200 can be a DC-to-DC converter package, that is, a power supply module package structure. As shown in FIG. 2, electronic package structure 200 includes a metal core printed circuit board (MCPCB) 210, a plurality of electronic components 220, a plurality of conducting wires 230 and an energy storage device 240. The electronic components 220 are disposed on a first side of MCPCB 210 and coupled to a circuit layout (not shown) in MCPCB 210. In this embodiment, the electronic components 220 include a first electronic component 221 and a second electronic component 222. Heat generated by the first electronic component 221 is larger than that by the second electronic component 222. Specifically, the first electronic component 221 can be a power element, that is, an electronic component generating a large amount of heat, such as chip, integrated component, metal-oxide-semiconductor field-effect transistor (MOSFET), insulated-gate bipolar transistor (IGBT), diode, main transformer and synchronous rectifier. The second electronic component 222 can be a passive component or microelectronic component, that is, an electronic component generating a small amount of heat.

MCPCB 210 includes a metal layer 211 and a circuit layer 212. The circuit layer 212 includes at least one conducting wiring layer 212a and an insulating layer 212b to form the circuit layout 212c. The metal layer 211 is disposed on the second side of the MCPCB 210 and the second side is opposite to the first side. In one embodiment, in order to increase the effect of heat dissipation, the metal layer 211 is disposed over the entire bottom surface of the circuit layer 212.

In this embodiment, the MCPCB 210 defines at least one through hole 216. The through hole 216 penetrates the bottom surface 21b and the top surface 21a of MCPCB 210. An insulating layer 213 and a thermal passage 214 are disposed in the through hole 216, and the insulating layer 213 is disposed on a wall defining the through hole 216 and defines an opening. The thermal passage 214 is disposed in the opening so that the insulating layer 213 is disposed between the thermal passage 214 and the metal layer 211. In one embodiment, the material of the thermal passage 214 is metal. Since the insulating layer 213 is disposed between the thermal passage 214 and the metal layer 211 of the MCPCB 210, there is no current loop between the thermal passage 214 and the metal layer 211.

The energy storage device 240 may be an inductor device, more specifically, a choke device including a choke 242 and a plurality of connecting pins 241. The connecting pins 241 are disposed at two sides of the choke 242, coupled to the choke 242 and extend along a direction away from the bottom surface of the choke 242. The energy storage device 240 is disposed on the first side of the MCPCB 210 and one connecting pin 241 is connected to one thermal passage 214. A space is defined between the choke 242 and the MCPCB 210 to accommodate electronic components 220. By such design, the energy storage device 240 and the electronic components 220 are not disposed on a flat surface but form a stacking structure to use space effectively. Besides, heat generated by the choke 242 can be dissipated to the second side of the MCPCB 210 through the connecting pin 241 and the thermal passage 214. Since the thermal passage 214 is made of metal, the choke 242 can be electrically coupled to the external circuit board 900 through the connecting pins 241 and the thermal passage 214. The external circuit board 900 is disposed on the second side of the MCPCB 210 and the choke 242 is disposed on the first side of the MCPCB 210.

Besides, since the first electronic component 221 generated a larger amount of heat, a pin 21c of the first electronic component 221 is in thermal contact with the thermal passage 214 and heat generated by the first electronic component 221 can be conducted to the second side of the MCPCB 210 through the pin 21c and the thermal passage 214. Since the thermal passage 214 is made of metal, the first electronic component 221 may be electrically coupled to the external circuit board 900 through the thermal passage 214.

In the embodiment of FIG. 2, the insulating layer 213 can be a plastic sheath. The plastic sheath can be, for example, an "H"-shaped plastic expansion bolt 13a or sleeve expansion bolt. The thermal passage 214 may be a rivet 14a. Processing the insulating layer 213 and the thermal passage 214 can include the following steps. Step S02: at least one through hole 216 is formed on the MCPCB 210 in advance. Step S04: the "H"-shaped plastic expansion bolt 13a is plugged in the through hole 216. Step S06: finally the metallic rivet 14a is nailed into the "H"-shaped plastic expansion bolt 13a. In one embodiment, the firstly rivet 14 is nailed into the "H"-shaped plastic expansion bolt 13a and then the rivet 14 and the "H"-shaped plastic expansion bolt 13a together are plugged into the through hole 216.

Figure 3:
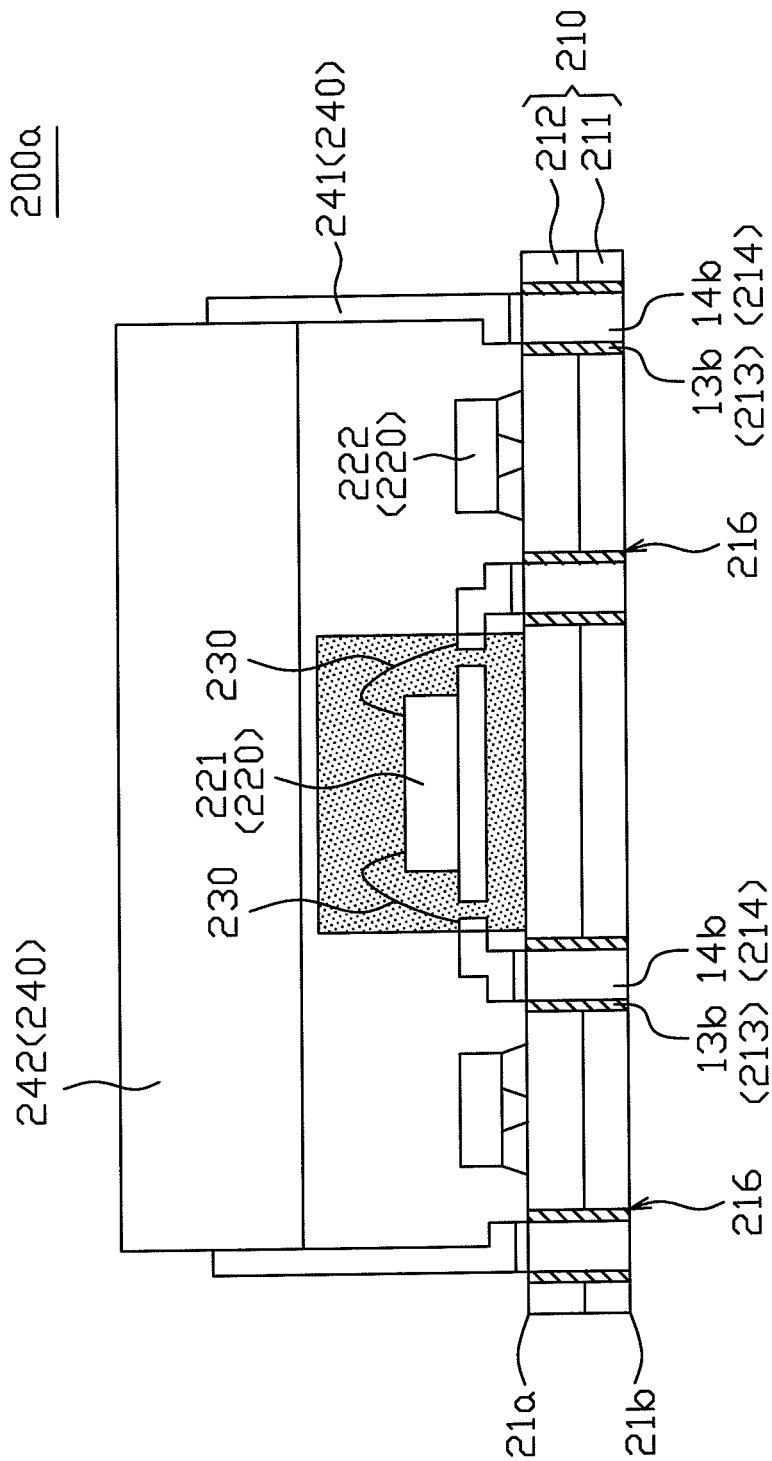
FIG. 3 shows a schematic diagram illustrating an electronic package structure according to one embodiment of the invention.

FIG. 3 shows a schematic diagram illustrating an electronic package structure according to one embodiment of the invention. The electronic package structure 200a of the embodiment of FIG. 3 is similar to the electronic package structure 200 of the embodiment of FIG. 2. Thus, the same element is represented by the same symbol and its details are also not given hereinafter. As shown in FIG. 3, processing the insulating layer 213 and the thermal passage 214 can include the following steps. Step S22: at least one through hole 216 is formed on the MCPCB 210 in advance. Step S24: a polymeric material is filled into the through hole 216. Step S26: an opening is formed in the polymeric material to have the area of the opening be smaller than that of the through hole 216 so as to form an insulating film 13b. Step S28: finally thermally conductive material 14b is filled into the opening. In one embodiment, the thermally conductive material 14b made of metallic material can be formed by electroplating. In one embodiment, the thermally conductive material 14b can be formed by filling metallic conductive paste into the opening and then carrying out annealing.

As described in the above, after the insulating layer 213 and the thermal passage 214 are formed on the MCPCB 210, each electronic component 220 is formed on the surface of the first side of the MCPCB 210 (step 32). Finally, the energy storage device 240 is disposed on the first side of the MCPCB 210 to have one connecting pin 241 be connected to one rivet 14a or one thermally conductive material 14b (thermal passage 214). In addition, a space is defined between the choke 242 and the MCPCB 210 to accommodate the electronic components 220. Thus, the electronic package structure 200 or the electronic package structure 200a is formed.

In the electronic package structure 200 of the embodiment of FIG. 2, the insulating layer 213 and the thermal passage 214 are implemented by the plastic expansion bolt 13a and the rivet 14a, respectively. Additional processes, such as repeatedly excavating holes and filling materials, are not needed and thus production is simple and cost is low. On the other hand, in the electronic package structure 200a of the embodiment of FIG. 3, the insulating layer 213 and the thermal passage 214 can be formed into various shapes and sizes and are suitable to products having complex circuits. Besides, in one embodiment, the insulating layer 213 and the thermal passage 214 are implemented by the insulating film 13b and the rivet 14a, respectively. In another embodiment, the insulating layer 213 and the thermal passage 214 are implemented by a plastic sheath (13a) and the thermally conductive material 14b, respectively.

As described in the above, a storage space is formed between the energy storage device 240 and the MCPCB 210. A plurality of electronic components 220 are disposed on the MCPCB 210 and in the storage space to from a stacking structure which uses space effectively so that a high density integrated power device can be formed. Since the MCPCB 210 is formed with the insulating layer 213 and the thermal passage 214, the connecting pin 241 of the energy storage device 240 can be coupled to the thermal passage 214 and heat generated by the energy storage device 240 can be conducted to the second side of the MCPCB 210 through the connecting pin 241 and the thermal passage 214. When the thermal passage 214 is made of metal, the thermal passage 214 is electrically conductive and the energy storage device 240 may be in electrically connection with an external circuit board through the thermal passage 214.

Figure 4:
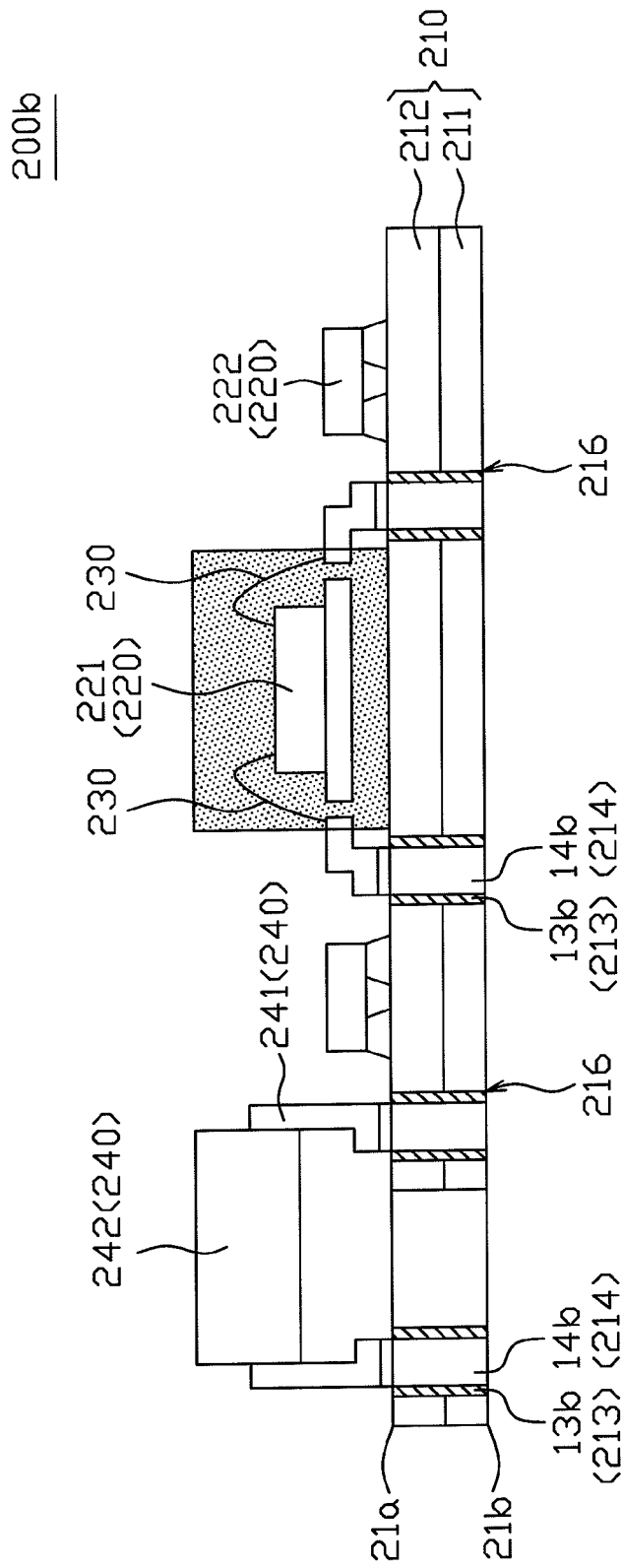
FIG. 4 shows a schematic diagram illustrating an electronic package structure according to one embodiment of the invention.

Besides, in the invention, it is not limited to form a storage space between the energy storage device 240 and the MCPCB 210 so as to from the electronic package structure 200 having a stacking structure. FIG. 4 shows a schematic diagram illustrating an electronic package structure according to one embodiment of the invention. The electronic package structure 200b of the embodiment of FIG. 4 is similar to the electronic package structure 200 of the embodiment of FIG. 2. Thus, the same element is represented by the same symbol and its details are also not given hereinafter. As shown in FIG. 4, the choke 242 and the electronic components 220 are disposed on the surface of the MCPCB 210 and are not formed into a stacking structure. Heat generated by the choke 242 is conducted to the second side of the MCPCB 210 through the connecting pin 241 and the thermal passage 214.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. An electronic package structure, comprising:
    a metal core printed circuit board, comprising a first surface and a second surface and defining at least one through hole wherein the first surface is opposite to the second surface, the through hole extends from the first surface to the second surface, and the metal core printed circuit board comprises:
        a metal layer, disposed on the second surface of the metal core printed circuit board;
        a circuit layer, disposed on the metal layer and comprising a circuit layout, wherein the circuit layer includes at least one conducting wiring layer and a layout insulating layer to form the circuit layout, and the metal layer is disposed over the entire bottom surface of the circuit layer;
    at least one insulating layer, disposed in the at least one through hole; and
    at least one rivet, nailed into and secured in the at least one through hole wherein the at least one insulating layer is positioned between the at least one rivet and the metal layer so that the at least one rivet is electrically insulated from the metal layer, wherein the at least one rivet is solid so as to form at least one thermal passage, and does not have space inside it, and the at least one rivet has a top surface disposed on the first surface of the metal core printed circuit;
    an energy storage device, comprising at least one connecting pin, wherein
        the at least one connecting pin is connected to the top surface of the at least one rivet so as to be in thermal contact with the at least one thermal passage and extends toward a direction away from the energy storage device, so that heat generated by the energy storage device is dissipated to the second surface of the metal core printed circuit board through the at least one connecting pin and the at least one thermal passage, and
        a storage space is formed between the energy storage device and the metal core printed circuit board and is defined by the energy storage device, the metal core printed circuit board and the at least one connecting pin; and
    at least one electronic component, formed on the first surface of the energy storage device, coupled to the circuit layout and disposed in the storage space, wherein a part of the energy storage device is disposed above the at least one electronic component.

2. The electronic package structure according to claim 1, wherein
    the numbers of the at least one through hole, the at least one insulating layer and the at least one thermal passage are plural;
    the electronic components comprise a first electronic component and a second electronic component; and
    heat generated by the first electronic component is larger than that by the second electronic component and the first electronic component is in thermal contact with one of the thermal passages.

3. The electronic package structure according to claim 1, wherein the at least one insulating layer comprises a plastic sheath being an expansion bolt.

4. The electronic package structure according to claim 3, wherein the at least one rivet is made of metal and the at least one connecting pin is electrically connected to the top surface of the at least one rivet so that the energy storage device is connected to an external circuit board.

5. The electronic package structure according to claim 1, wherein the at least one insulating layer comprises an insulating film.

6. The electronic package structure according to claim 1, wherein the at least one rivet is made of metal and the at least one connecting pin is electrically connected to the thermally conductive material.

7. The electronic package structure according to claim 1, wherein the electronic package structure is a DC-to-DC converter package.

8. The electronic package structure according to claim 1, wherein the energy storage device further comprises a choke and the at least one connecting pin is disposed on one side of the choke.

9. A metal core printed circuit board, comprising a first surface and a second surface and defining at least one through hole wherein the first surface is opposite to the second surface, the through hole extends from the first surface to the second surface, and the metal core printed circuit board comprises:
- a metal layer, disposed on the second surface of the metal core printed circuit board;
- a circuit layer, disposed on the metal layer and comprising a circuit layout, wherein the circuit layer includes at least one conducting wiring layer and a layout insulating layer to form the circuit layout, and the metal layer is disposed over the entire bottom surface of the circuit layer;
- at least one insulating layer, disposed in the at least one through hole, wherein the at least one insulating layer comprises a plastic sheath being an expansion bolt;
- at least one rivet, nailed into and secured in the expansion bolt, wherein the expansion bolt of the at least one insulating layer is disposed between the at least one rivet and the metal layer so that the at least one rivet is electrically insulated from the metal layer, wherein the at least one rivet is solid so as to form at least one thermal passage, and does not have space inside it, and the at least one rivet has a top surface disposed on the first surface of the metal core printed circuit; and
- at least one connecting pin, connected to the top surface of the at least one rivet.

\* \* \* \* \*